United States Patent
Yates

(10) Patent No.: US 7,239,235 B2
(45) Date of Patent: Jul. 3, 2007

(54) NON-CONTACT SENSOR IDLE VALIDATION SWITCH

(75) Inventor: Fred Eugene Yates, Lebanon, OR (US)

(73) Assignee: Williams Controls Industries, Inc., Portland, OR (US)

( * ) Notice: Subject to any disclaimer, the term of this patent is extended or adjusted under 35 U.S.C. 154(b) by 105 days.

(21) Appl. No.: 11/089,632

(22) Filed: Mar. 25, 2005

(65) Prior Publication Data
US 2005/0219047 A1 Oct. 6, 2005

Related U.S. Application Data

(60) Provisional application No. 60/559,276, filed on Apr. 1, 2004.

(51) Int. Cl.
B60L 1/00 (2006.01)
F02D 11/10 (2006.01)
(52) U.S. Cl. .................. 340/507; 340/686.1; 340/644; 307/10.1; 123/399; 701/107
(58) Field of Classification Search ................ 340/507, 340/686.1, 644; 307/10.1, 127; 123/399; 701/107, 114
See application file for complete search history.

(56) References Cited

U.S. PATENT DOCUMENTS

| 4,412,166 | A | * | 10/1983 | Crider et al. ................ 318/696 |
| 4,482,818 | A | * | 11/1984 | Ryczek et al. ............... 327/496 |
| 4,958,607 | A | | 9/1990 | Lundberg |
| 4,976,166 | A | | 12/1990 | Davis |
| 5,133,225 | A | | 7/1992 | Lundberg |
| 5,133,321 | A | | 7/1992 | Hering |
| 5,179,307 | A | * | 1/1993 | Porter ...................... 310/68 B |
| 5,237,891 | A | | 8/1993 | Neubauer |
| 5,321,980 | A | | 6/1994 | Hering |
| 5,438,516 | A | | 8/1995 | Neubauer |
| 5,493,275 | A | * | 2/1996 | Easter ...................... 340/572.3 |
| 5,737,994 | A | * | 4/1998 | Escobosa ...................... 91/361 |
| 6,414,607 | B1 | | 7/2002 | Gonring |
| 6,507,283 | B1 | * | 1/2003 | Calvin ........................ 340/644 |
| 6,522,131 | B1 | * | 2/2003 | Hiligsmann et al. ..... 324/207.2 |
| 2005/0178602 | A1 | * | 8/2005 | Bolduc et al. .............. 180/279 |

* cited by examiner

*Primary Examiner*—Jeffery Hofsass
*Assistant Examiner*—Anne V. Lai
(74) *Attorney, Agent, or Firm*—Schwabe, Williamson & Wyatt, P.C.

(57) ABSTRACT

A switch is disclosed having first and second switch elements each configured to provide power to a sensor when in one state and configured to switch to a second state and provide positional information, for example. The sensor configured to effect the first and second switches to switch to the second state and to switch back to the one state, the first and second switch elements configured to switch alternately and in a complementary way.

19 Claims, 4 Drawing Sheets

NON-CONTACT SENSOR IDLE VALIDATION SWITCH

RELATED APPLICATIONS

This application claims priority to U.S. Provisional Application No. 60/559,276, filed on Apr. 1, 2004 entitled "Non-Contact Sensor Idle Validation Switch," which is hereby fully incorporated by reference.

TECHNICAL FIELD

Embodiments of the present invention relate generally to switches used with sensors, and more particularly to a switch which may be used with non-contact sensors that would otherwise require an additional wire to implement.

BACKGROUND

Current electrical requirements for heavy-duty diesel engines, for example, require several electrical inputs to the Engine Control Unit (ECU) from the electronic throttle control. These inputs are typically a single analog signal, which changes in response to the driver's request for fuel, and a position switching function which is a signal to the engine that the throttle is at idle or is at some other specific point. These position sensors have typically been mechanical contact electrical devices.

Non-contact electronic sensors are emerging as the sensor of choice for a variety of reasons. Non-contact sensors, however, may not be able to provide the switch using the existing wiring and electrical strategies. One such switch type that non-contact sensors are incompatible with is a switch type known as a form "C" switch.

FIG. 1 illustrates an electrical diagram of a typical ECU for an Idle Validation Switch (IVS) input that may be implemented using a form "C" switch. Such inputs may be provided to the form "C" switching device to allow the ECU to sense the state of the Normally Open (NO) and Normally Closed (NC) signals associated with the IVS. Form C switches are implemented either such that one contact is broken before the second contact is made, which is typically referred to as "break before make" or both contacts are made at the same time, which is referred to as "make before break".

Certain engine manufacturers may require that the source of ground and power to the IVS and the Accelerator Position Sensor (APS) be independent of one another. Such a requirement would limit the switching apparatus such that the apparatus may not use the same ground and power source that the APS uses. This typically does not present a problem for contact type resistive potentiometers, as they typically use the completion of a circuit to register the switching function. Because a non-contact sensor may use active electronic devices, however, each of the IVS and APS functions may have its own source of power and ground, independent of the other. A form C switch, for example, requires three wires to implement the common (COM), normally closed (NC) and normally open (NO) terms, where one wire is a common return and the other two wires carry the NC and NO signals to the engine control unit. A typical APS may also require three wires to implement the device.

Therefore the typical wiring harnesses for vehicles only requires a 6-wire interface which may be incompatible with non-contact sensors. Currently, to accommodate non-contact sensors, vehicle manufacturers must change their wiring harness and connector configuration to add a seventh wire in order to accommodate the additional power or ground reference.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DESCRIPTION OF EMBODIMENTS IN ACCORDANCE WITH THE PRESENT INVENTION

In the following detailed description, reference is made to the accompanying drawings which form a part hereof, and in which are shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Disclosed embodiments of the invention relate to idle validation switches (IVS), and more particularly, embodiments of the invention relate to methods and apparatuses for non-contact sensors to be used with certain switches and existing wiring and electrical configurations.

Embodiments in accordance with the present invention include a non-contact sensor that may interface with an engine controller to provide the switching function in a form "C" IVS under certain conditions. Embodiments in accordance with the present invention may include a non-contact sensor that may interface with an engine controller to provide the switch function in a sensor where the borrowing of some current from one side of the switch or the other is allowed by design and/or specification of the switch.

Figure 1:
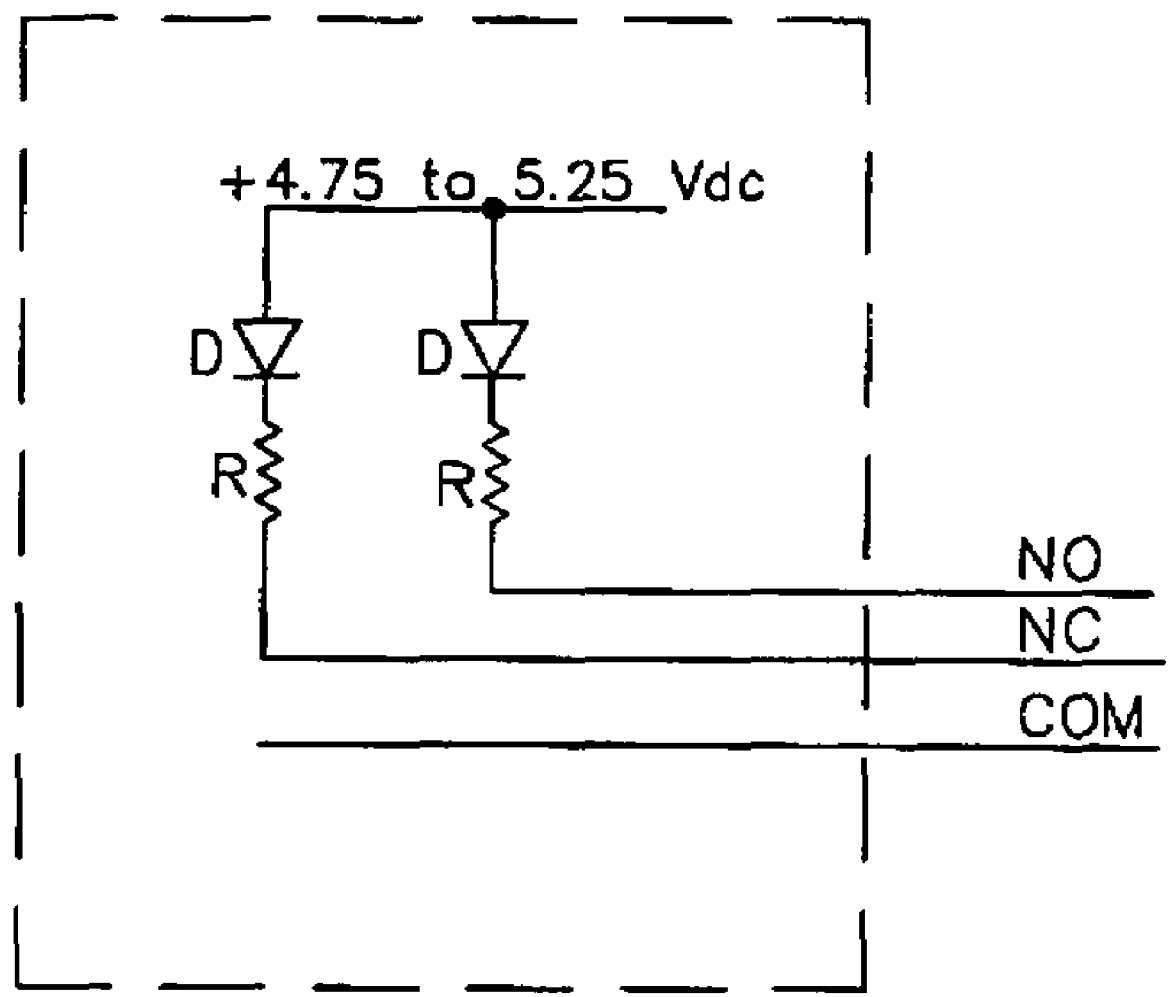
FIG. 1 illustrates an electrical diagram of a typical engine control unit (ECU) for an idle validation switch (IVS)
Figure 2:
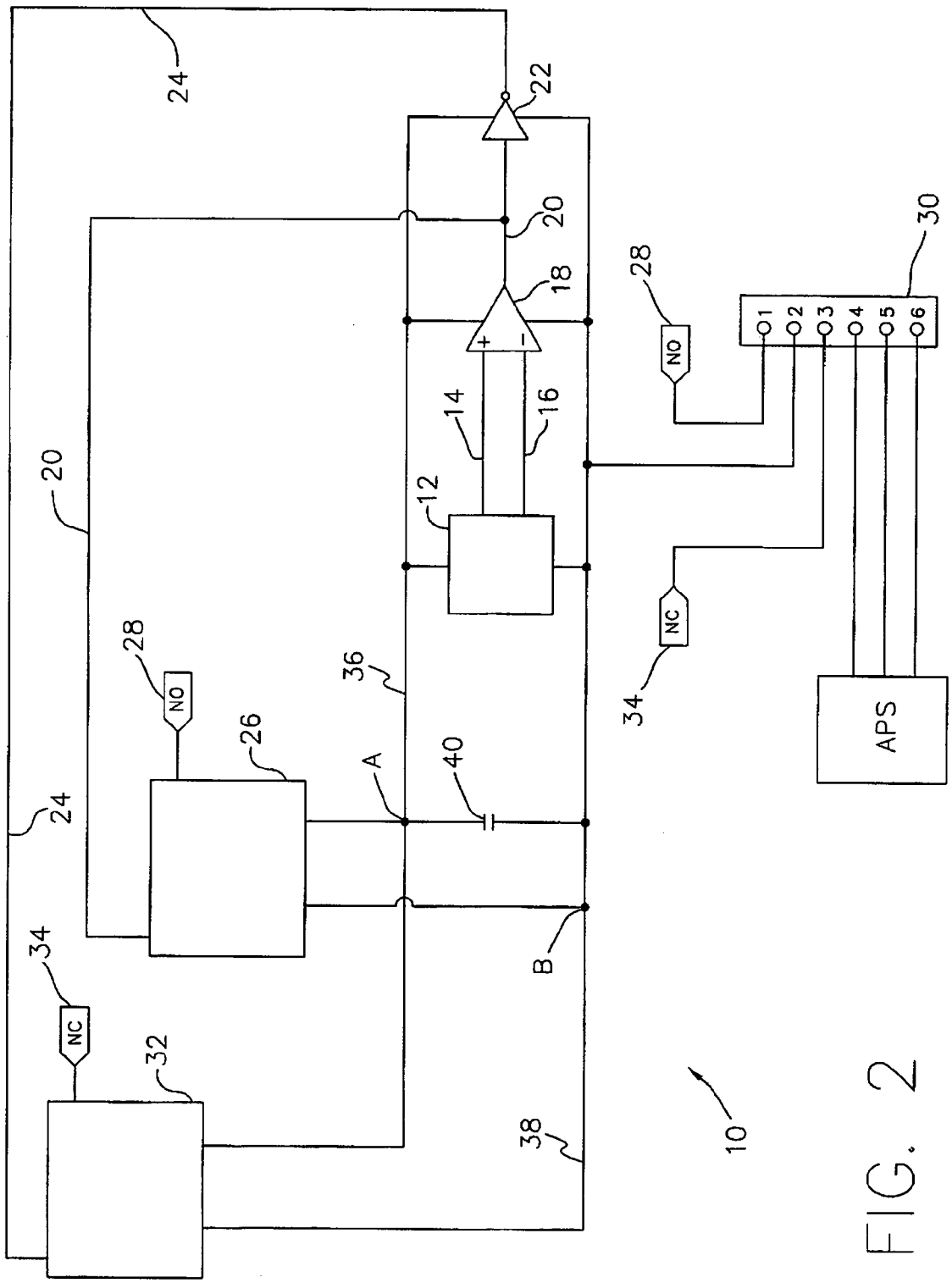
FIG. 2 illustrates an electrical diagram of a first embodiment of the invention.

FIG. 2 illustrates a circuit diagram according to a first described embodiment of the invention. Certain lines or branches of the described circuit may be used to transfer current and may be used to transfer a signal. Certain lines or branches may also be used to provide power. The accompanying description and figure(s) may illustrate one or more signals by identifying the branch, path or line along which it travels. A switch 10 includes a non-contact sensor 12, configured to output a first and second signal 14 and 16. A comparator 18 may be coupled to the sensor 12, and configured to receive the first and second signals 14, 16. Comparator 18 may be further configured to generate a third signal 20 upon receiving dissimilar first and second signals. An inverter 22 may be coupled to the comparator 18 and configured to receive the third signal 20. Inverter 22 may be further configured to invert the third signal 20 to a fourth switch signal 24. Depending on the direction of displacement of an actuator which may be a throttle pedal (not shown), the sensor 12 may output one signal, for example the first signal 14, which is a more positive signal, and second signal 16, which may be a more negative signal. The third signal 20 may therefore be a correspondingly high signal or a low signal depending on the relative values of the first and second signals. The fourth signal 24 may therefore be a corresponding opposite signal, for example when third switch signal may be high the fourth switch signal is low.

A first switch element 26 may be at one state which may be referred to as a first state for illustration purposes only, for example open, and may be coupled to the comparator 18 and may be configured to receive the third signal 20. The terms used should not be interpreted to imply any particular order, or limited in any way to an order or particular state. Another term that may be used, for example, is state A. Upon receipt of the third signal 20, for example a high signal, the first switch element 26 may be configured to change to a second state, for example from closed to open. The first switch element 26 may also be configured to output its condition, for example an open condition may be outputted when the first switch element is open, and a closed condition may be outputted when the first switch is closed. The outputted condition may be used for various purposes to communicate information, used for example, to validate a condition such as a threshold condition. The outputted condition may be used as positioning information of a throttle pedal which may be used by an ECU. The outputted condition may also be used, for example, to validate a temperature, pressure or volume level or any other parameter. Tag 28 indicates that the first switch element 26 may have a defined condition of normally open indicated as "NO". Tag 28 shown adjacent first switch element 26 may be considered connected to or the same as tag 28 shown in a lower part of the figure. A 6-wire connector 30 having six connection point to connect to an engine control unit (ECU) (not shown) is illustrated with circles and numbers 1, 2, 3, 4, 5, and 6. The connector 30 may connect to the ECU by way of a six wire harness (not shown). The condition of switch 26 may thereby be communicated to the ECU.

A second switch element 32 may be at the second state for example closed, and may be coupled to the inverter 22 configured to receive the fourth signal 24. As discussed the term used may not necessarily indicate order. Other terms such as state B or an other state may be used Upon receipt of the fourth signal 24 the second switch element 32 may be configured to change from the second state to the first state, for example from closed to open. The second switch element may be configured to output its condition. For example, a closed condition is outputted when the switch is in the closed state, and an open condition may be outputted when the first switch is open. As briefly discussed the outputted condition may be used to validate the point or level of any parameter.

As indicated by tag 34 the second switch element 32 may be defined condition of normally closed indicted as "NC" on tag 34. Tag 34 may be considered to be connected or the same as tag 34 shown connected to the 6-wire connector 30. The condition of switch 32 may thereby be communicated to the ECU.

The first state and the second state may be complementary to one another in that when one switch is at a first state the other switch is at the second state. The first switch element 26 and the second switch element 32 may be configured to alternatively provide power to the non-contact sensor 12 when in one of the first state and the second state. Power is thereby alternately shunted to the sensor 12 by first switch element 26 and then by second switch element 32. In some embodiments, including the currently described embodiment, the first 26 and second 32 switch elements may also be configured to alternately provide power to the comparator 18 and the inverter 22.

The first switch element 26 may be coupled to a first path 36 at point A and coupled to a second path 38 at a point B. First switch element 26 may maintain a voltage difference across first path 36 and second path 38 when in either one of the first state and the second state, for example the open state. Sensor 12, comparator 18 and inverter 22 may be coupled to the first path and the second path thereby providing power to each of the sensor 12, the comparator 18 and the inverter 22.

The second switch element 32 may also be coupled to the first path 36 at point A and coupled to the second path 38 at a point B. Second switch element 32 may maintain a voltage difference across first path 36 and second path 38 when in one of the first state and the second state.

As the first 26 and second 32 switch elements alternately switch between the first and second complementary states which may be referred to as a switch transition, the first 36 and second 38 paths nearly continuously or continuously maintain a voltage difference. To ensure a substantially continuous voltage difference is maintained a power filter 40 is arranged across the first 36 and second 38 paths. The power filter 40 may be, for example, a capacitor.

So configured, switch 10 may then be able to provide two outputs, for example open or closed and does not require separate power and ground, or common connections but may be connected to a third path of an idle validation switch.

Figure 3:
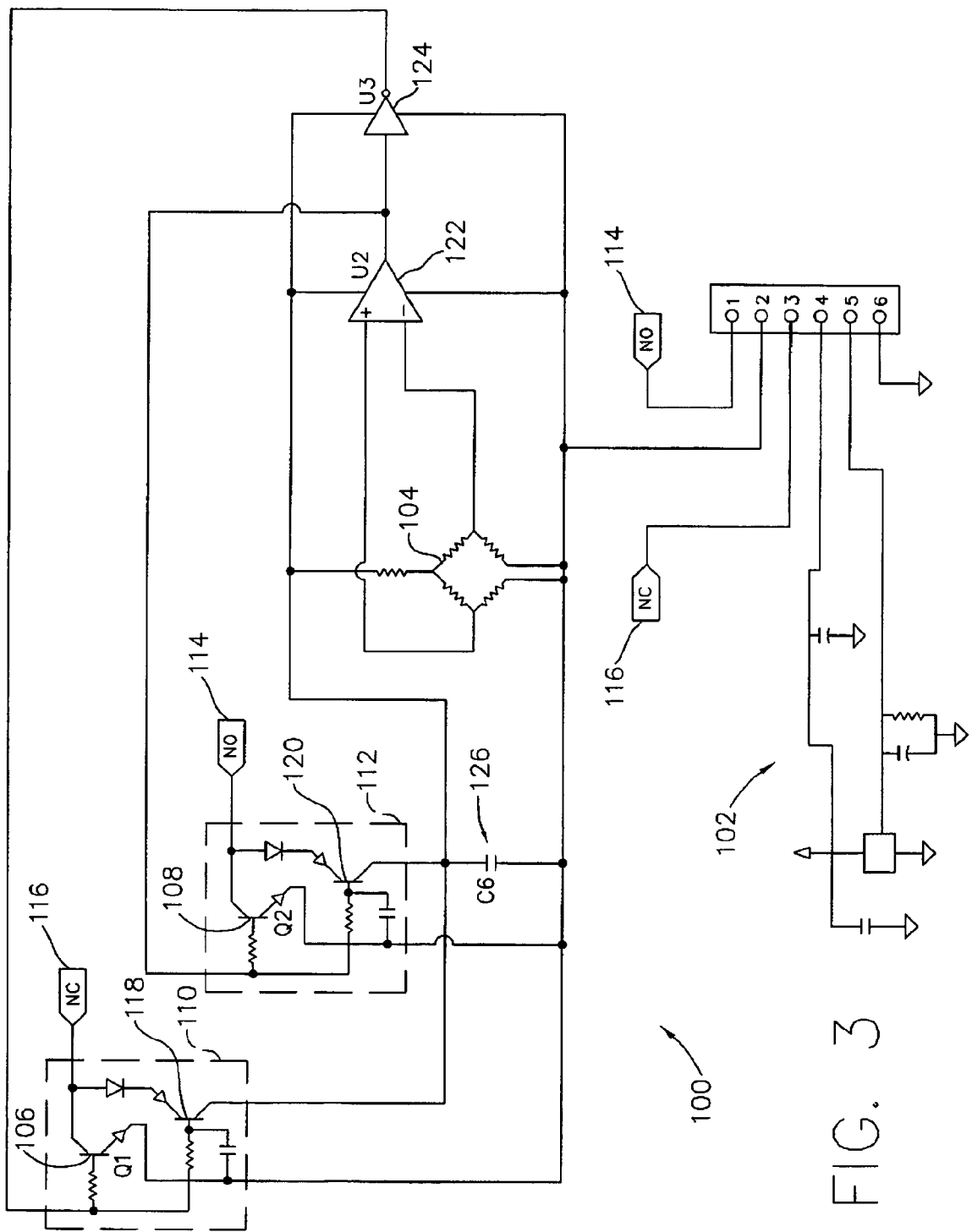
FIG. 3 illustrates an electrical diagram of a second embodiment of the invention.

FIG. 3 illustrates an electrical diagram of an IVS control circuit 100 and an APS circuit 102 in accordance with a second embodiment of the present invention. It can be appreciated that the APS circuit 102, though illustrated, is not required and is shown for reference only. The circuit 100 provides output switch signals that may meet certain manufacturer specifications, without requiring a reconfiguration of the standard six-wire wiring harness configurations (not shown). In one embodiment, the circuit may include a "wheatstone bridge" 104, which may be in the form of a magnetoresistive device, which may shift balance in response to the position of a device having a magnetic field, such as a magnet, and arranged to move with the movement of a pedal which may be arranged adjacent the bridge 104. The circuit may then sense the movement of the pedal. One such example of a magnetoresistive device is the HMC1501, manufactured by Honeywell. It can be appreciated, however, that other known devices may be used to initiate a switch transition, including, but not limited to variable capacitors, variable inductors, light sensitive devices, etc.

The offset signal from the magnitoresistive device 104 may be used to turn on and off NPN transistors 106 and 108 respectively located in a first switch element (Q1) 110 and a second switch element (Q2) 112. The state of the two respective switch elements 110 and 112 may correspond to two signal output points identified as NO tag 114 and NC tag 116. At the same time the resultant signal may be used to control how power is supplied to the circuit by turning on and off the respective PNP transistors 118 and 120 also located in first switch element 110 (Q1) and second switch element 112 (Q2). For example, if the NC term is being held low with the NPN transistor 106 is switched on in the first switch element 110 (Q1), the PNP transistor 120 in the second switch element 112 Q2 would be switched on to provide power. In the embodiment illustrated, switch elements 110 (Q1) and 112 (Q2) each comprise two bipolar junction transistor devices, one NPN and one PNP transistor.

An example of such a device is the BC848BPDW1T1 from ON Semiconductor, Phoenix, Ariz. It can be appreciated, however, that other known discrete devices may be used to implement the NPN and PNP transistor arrangement.

In one embodiment in accordance with the present invention, low power CMOS circuitry and high beta transistors may be utilized so that power consumption may be reduced. This may reduce adverse effects such as, a false logic level indication on the non-switched signal output point.

In one embodiment, the switch 100 may include a bridge 104 in an unbalanced condition, with a comparator (U2) 122 being at either be at logic one or zero. Assuming, for example, the output of U2 122 is at a logic one (high), the signal applied to both transistors in second switch element (Q2) 112 may result in the NO term, controlled by the NPN transistor 108, being switched low and the power shunting PNP transistor 120 to be turned off (inactive). The high level at the output of comparator 122 U2 may force the output of an inverter (U3) 124 to be at logic zero (low). This signal applied to both transistors in switch element 110 Q1 may result in the NC term, controlled by the NPN transistor, being switched off (inactive) and the power shunting PNP transistor to be turned on (active). This may then charge up C6, which is the power supply filter 126 for the bridge 104, comparator 122 and inverter 124. When the bridge output is such that the output of the comparator 122 U2 is low the opposite conditions will exist, i.e the NC term will be low and power will be shunted from the NO term.

It can be appreciated that FIG. 3 is used by way of example and though certain values, devices and/or circuits are identified, they are not required, and a variety of values, devices and/or circuits may be added, substituted, or interchanged depending on the operation demands. Embodiments in accordance with the present invention may be used to provide a non-contact IVS sensor that may be compatible with existing 6-wire harnesses, particularly where the manufacture's specifications allow for a minimal amount of power to be drawn from the un-switched term.

Figure 4:
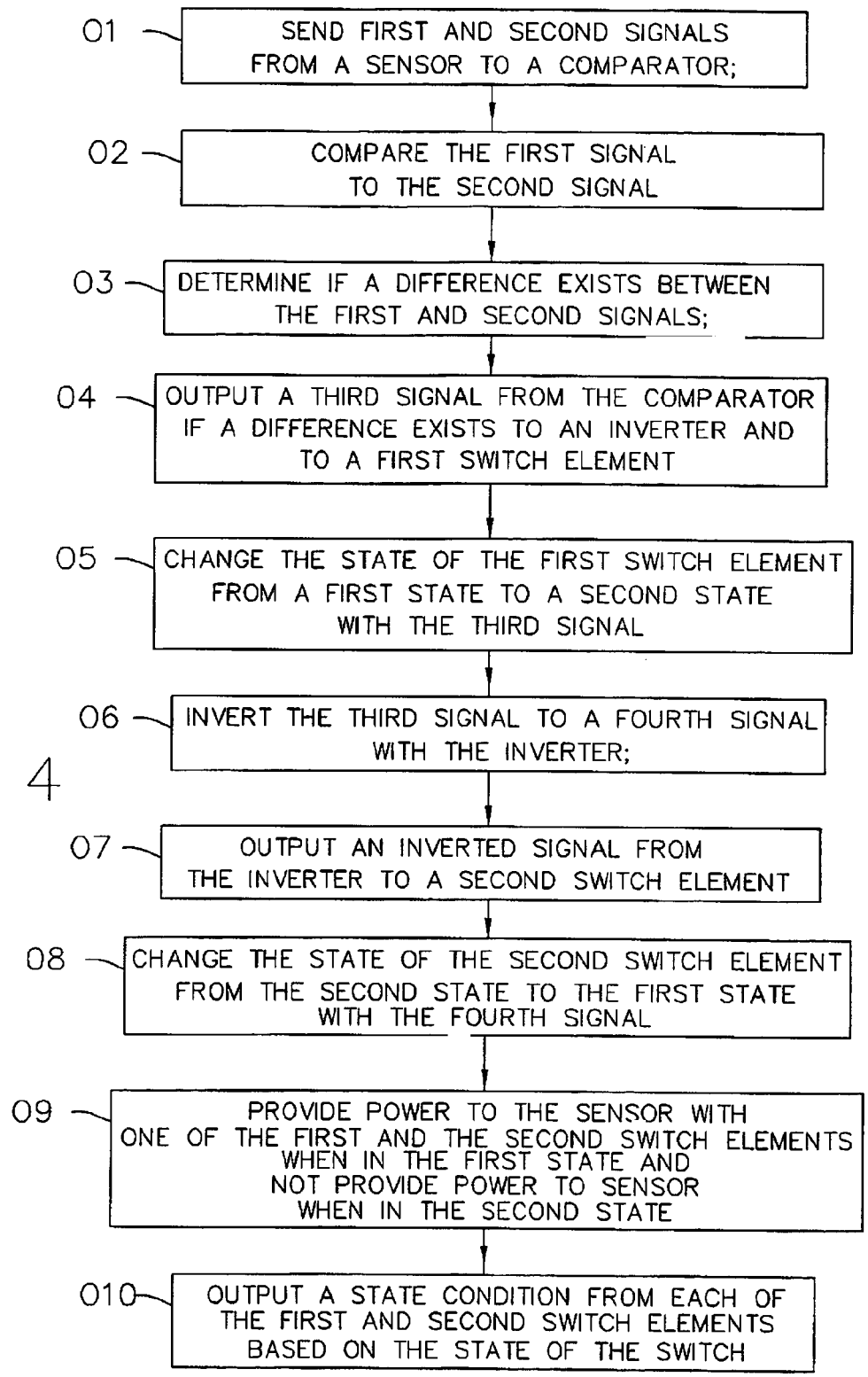
FIG. 4 is a flow diagram illustrating a method according to another embodiment of the invention.

FIG. 4 is a flow diagram illustrating a method according to an embodiment of the invention.

The method includes:

O1, sending first and second signals from a sensor to a comparator;

O2, comparing the first signal to the second signals;

O3, determining if a difference exists between the first and second signals;

O4, outputting a third signal from the comparator if a difference exists to an inverter and to a first switch element;

O5, changing the state of the first switch element from a first state to a second state with the third signal;

O6, inverting the third signal to a fourth signal with the inverter;

O7, outputting an inverted signal from the inverter to a second switch element;

O8, changing the state of the second switch element from the second state to the first state with the fourth signal;

O9, providing power to the sensor with one of the first and the second switch elements when in the first state and not providing power to sensor when in the second state; and O10, outputting a state condition from each of the first and second switch elements based on the state of the switch.

Although the illustrated embodiments have been discussed with respect to the IVS function in a contact-less sensor device, it can be appreciated by those of skill in the art that embodiments in accordance with the present invention may be used in any application that uses a form C switch (or similar type switch) and logic inputs for control that has three wire harness as described herein. Other embodiments may include, but are not limited to liquid level sensing, proximity sensing, gear tooth counting, valve position and/or shaft travel.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A switch comprising:
   a first switch element configured to provide power to a non-contact sensor when in a state A and configured to switch to a state B;
   a second switch element configured to provide power to the non-contact sensor when in the state A and configured to switch to the state B;
   the sensor configured to effect the first and second switch elements to switch between states, the first and second switch elements configured to alternately and complementarily switch between state A and state B, wherein when either the first or second switch element is in state A power is being provided to the sensor by the respective first or second switch element to power the sensor to perform a sensing operation.

2. The switch of claim 1 wherein the first switch element and the second switch element are further configured to provide positional information when in state B.

3. The switch of claim 1 wherein the sensor is one selected from the group consisting of a wheatstone bridge, variable capacitor, variable inductor and a light sensitive device.

4. The switch of claim 1 wherein the state communicated by the first and the second switch elements is one of open and closed and the states are communicated via a 6 wire interface.

5. The switch of claim 1 wherein the sensor effects switching between the state A and the state B based on movement of an actuator.

6. The switch of claim 5 wherein the actuator is an accelerator pedal and the state A and the state B indicate the pedal is at a particular point.

7. The switch of claim 1 further comprising a first path and a second path, the first and second switch elements alternately providing a voltage potential across the first and the second paths.

8. The switch of claim 7 further comprising a comparator and an inverter, and wherein the sensor, the comparator and the inverter are coupled to each of the first and second paths thereby becoming energized.

9. The switch of claim 7 wherein one of the first and second paths being coupled to a third path of an idle validation switch arrangement.

10. A switch comprising:
    a non-contact sensor configured to output a first signal and a second signal;

a comparator coupled to the non-contact sensor configured to compare a relative difference between the first and second signals and further configured to output a third signal;

an inverter coupled to the comparator configured to receive the third signal and configured to invert the third signal to a fourth signal;

a first switch element coupled to the comparator configured to receive the third signal, and configured to change states upon receipt of the third signal;

a second switch element coupled to the inverter configured to receive the fourth signal, and configured to change states upon receipt of the fourth signal;

the state of the first switch element and the state of the second switch element being complementary to one another; and the first switch element and the second switch element configured to alternatively provide power in one state to the non-contact sensor and supply positional information in an other state.

11. The switch of claim 10 wherein the first switch element and the second switch element are configured to alternatively provide power to the comparator and the inverter when in the state A and the state B.

12. The switch of claim 10 wherein the first switch element and the second switch element are configured to alternately be in communication with an engine control unit.

13. The switch of claim 10 wherein the state A being a closed state and configured to provide positional information and the state B being an open state and configured to provide power.

14. The switch of claim 10 further comprising a power supply filter arranged to ensure a continuous supply of power to the sensor during a switch transition.

15. The switch of claim 10 wherein the first switch element and the second switch element each being connected to a first path and a second path and the power supply filter being arranged electrically across the first path and the second path.

16. A switch arrangement comprising:
a sensor;
a first switch element, having a state A and a state B, configured to provide power to the sensor when in the state A and configured to communicate its state when in state A;
a second switch element, having the state A and the state B, configured to provide power to the sensor when in the state B and configured to communicate its state when in state A;
the first state and the second state being complementary to one another wherein when one of the first switch element and the second switch element is in state A the other of the first switch element and the second switch element is in state B;
a comparator;
the sensor configured to send a signal to the comparator according to a position of a pedal, the comparator configured to cause the first switch element to change from state A to state B based on the signal from the sensor; and
an inverter coupled to the comparator and configured to cause the second switch element to change from state B to state A based on the signal from the sensor.

17. The switch arrangement of claim 16 wherein the sensor is a non-contact sensor and is one selected from the group consisting of: a wheatstone bridge, variable capacitor, variable inductor and a light sensitive device.

18. A method comprising:
sending first and second signals from a sensor to a comparator;
comparing the first signal to the second signals;
determining if a difference exists between the first and second signals;
outputting a third signal from the comparator if a difference exists to an inverter and to a first switch element;
changing the state of the first switch element from a first state to a second state with the third signal;
inverting the third signal to a fourth signal with the inverter;
outputting an inverted signal from the inverter to a second switch element;
changing the state of the second switch element from the second state to the first state with the fourth signal;
providing power to the sensor with one of the first and the second switch elements when in the first state and not providing power to sensor when in the second state; and
outputting a state condition from each of the first and second switch elements based on the state of the switch.

19. The method of claim 18 further providing power to the comparator and the inverter with one of the first and the second switch elements when in the first state and not providing power to the comparator and the inverter when in the second state.

* * * * *

UNITED STATES PATENT AND TRADEMARK OFFICE
CERTIFICATE OF CORRECTION

PATENT NO.        : 7,239,235 B2                                  Page 1 of 1
APPLICATION NO. : 11/089632
DATED             : July 3, 2007
INVENTOR(S)       : Fred E. Yates It is certified that error appears in the above-identified patent and that said Letters Patent is hereby corrected as shown below:

Column 7
Line 45 claim 16, "...state A;..." should read --...state B;...--.

Column 8
Line 23 claim 18, "...the second signals;" should read --...the second signal;--.

Signed and Sealed this

Fifth Day of August, 2008

JON W. DUDAS
*Director of the United States Patent and Trademark Office*